(12) United States Patent
Gilbert (10) Patent No.: US 6,348,829 B1
(45) Date of Patent: Feb. 19, 2002

(54) RMS-DC CONVERTER HAVING DETECTOR CELL WITH DYNAMICALLY ADJUSTABLE SCALING FACTOR

(75) Inventor: Barrie Gilbert, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/514,831

(22) Filed: Feb. 28, 2000

(51) Int. Cl.$^7$ .............................................. G06F 7/556
(52) U.S. Cl. ...................................................... 327/349
(58) Field of Search ................................ 327/184, 346, 327/347, 348, 349, 363, 531

(56) References Cited

U.S. PATENT DOCUMENTS

| | | | | |
|---|---|---|---|---|
| 5,473,244 A | * | 12/1995 | Libove et al. | 324/126 |
| 5,572,166 A | | 11/1996 | Gilbert | 330/254 |
| 5,585,757 A | * | 12/1996 | Frey | 327/348 |
| 5,900,822 A | * | 5/1999 | Sand et al. | 340/648 |
| 5,909,136 A | | 6/1999 | Kimura | 327/356 |
| 6,172,549 B1 | * | 1/2001 | Gilbert | 327/349 |

FOREIGN PATENT DOCUMENTS

JP           11225024        8/1999

OTHER PUBLICATIONS

Gilbert, Barrie; Current–mode Circuits From A Translinear Viewpoint: A Tutorial; *Analogue IC design: the current mode approach*; Peter Peregrinus, Ltd., London, United Kingdom; 1990 (pp. 11–91).

Gilbert, Barrie; Novel Technique for R.M.S.–D.C. Conversion Based on the Difference of Squares; Mar. 11, 1975; *Electronics Letters*, vol. 11, No. 8; pp. 181–182.

Surakampontorn, Wanlop; *A Dual Translinear–Based True RMS–to–DC Converter*; Apr. 1999; IEEE Transactions on Instrumentation and Measurement, vol. 47, No. 2, pp. 459–464.

\* cited by examiner

*Primary Examiner*—Jeffrey Zweizig
(74) *Attorney, Agent, or Firm*—Marger Johnson & McCollom, P.C.

(57) ABSTRACT

A high-frequency RMS-DC converter having extended dynamic range operates by dynamically at low cost by adjusting the scaling factor (denominator) of a detector cell such as a squaring cell. The output from the squaring cell is averaged to generate a final output signal which can be fed back to a scaling input for operation in a measurement mode, or used to drive a power amplifier in a controller mode. By implementing the squaring cell as a transconductance cell using a modified multi-tanh structure, the scaling factor can be adjusted by dynamically changing the tail current through the cell which, in the measurement mode, is achieved by connecting the averaged output back to the squaring cell. An exponentially responding amplifier can be used in the feedback loop to provide a linear-in-dB output characteristic.

31 Claims, 4 Drawing Sheets

RMS-DC CONVERTER HAVING DETECTOR CELL WITH DYNAMICALLY ADJUSTABLE SCALING FACTOR

BACKGROUND OF THE INVENTION

RMS-DC converters are used to convert the RMS (root-mean-square) value of an arbitrary signal into a quasi-DC signal that represents the power level of the signal being measured. Various techniques have been devised for performing RMS-to-DC conversions at frequencies ranging from DC to several GHz, some of which are disclosed in co-pending U.S. patent application Ser. No. 09/245,051 filed Feb. 4, 1999 and Ser. No. 09/256,640 filed Feb. 24, 1999 which are by the same inventor as the present application, and are incorporated herein by reference.

Performing accurate RMS-DC conversions over a wide dynamic range has proven difficult, especially at RF frequencies of several GHz. The need for wide dynamic range power measurement at very high frequencies has become more critical because the signals generated by modem communications systems such as those using CDMA (code division multiple access) have very wide instantaneous bandwidth (high crest factor), and because operating frequencies are continuously being pushed higher. One type of RMS-DC converter having an extended dynamic range is disclosed in co-pending U.S. patent application Ser. No. 09/473,309 filed Dec. 28, 1999, titled "RMS-DC Converter Having Gain Stages With Variable Weighting Coefficients" which is by the same inventor as the present application, and is incorporated herein by reference.

SUMMARY

An RMS-DC converter in accordance with the present invention includes a detector cell having a scaling factor which can be adjusted dynamically. The output from the detector cell is averaged to generate a final output signal.

DETAILED DESCRIPTION

Figure 1:
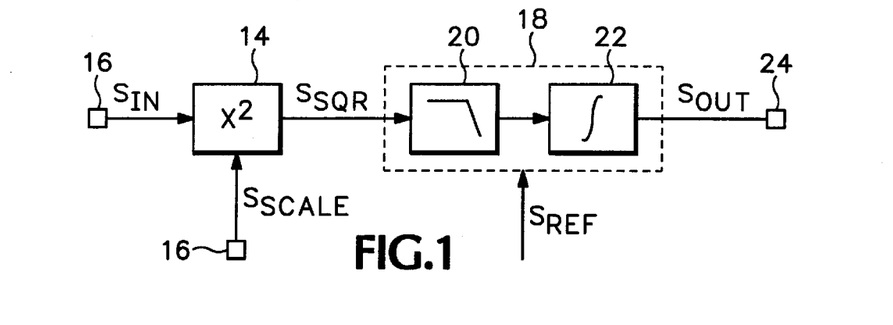
FIG. 1 is a block diagram of an embodiment of an RMS-DC converter in accordance with the present invention.

FIG. 1 is a block diagram of an embodiment of an RMS-DC converter in accordance with the present invention. The converter shown in FIG. 1 includes a squaring cell 14 which generates a squared signal $S_{SQR}$ having a magnitude equal to the square of the input signal $S_{IN}$ received at terminal 12 times a scaling factor which is controlled by a scaling signal $S_{SCALE}$ received at terminal 16. An averaging circuit 18 generates the final output signal $S_{OUT}$ at terminal 24. As a practical matter, if an RMS-DC converter in accordance with the present invention is used for high-frequency (RF) applications, the averaging circuit may need to accommodate two types of averaging: RF ripple filtering of the carrier signal, and long-term averaging of the modulation envelope. In the embodiment of FIG. 1, a low-pass filter 20 performs the RF ripple filtering, and an integrating circuit 22 provides the long-term averaging by integrating the difference between the filtered signal and a reference signal $S_{REF}$. However, even though the low-pass filter 20 and integrating circuit 22 are shown as separate blocks in FIG. 1, in some practical implementations, their functions can be combined in a single component as discussed below.

Figure 2:
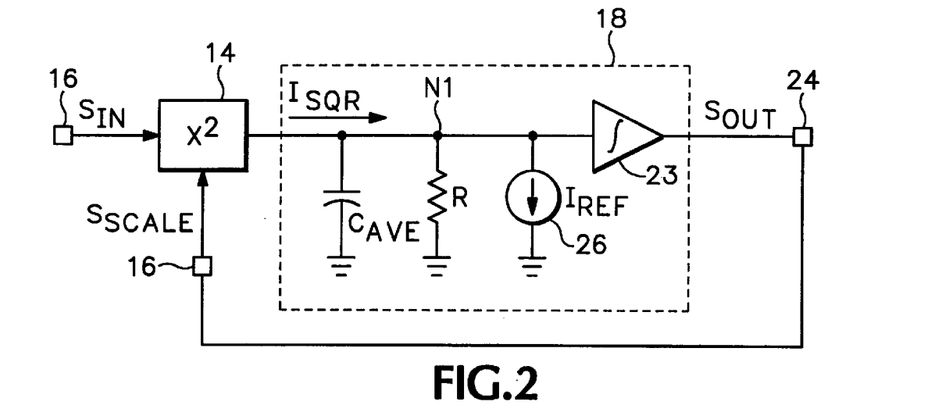
FIG. 2 is a simplified schematic diagram of a first exemplary embodiment of an RMS-DC converter in accordance with the present invention configured in a measurement mode.

FIG. 2 is a simplified schematic diagram showing a first exemplary embodiment of the RMS-DC converter of FIG. 1 configured for operation in a measurement mode in which the output signal $S_{OUT}$ is fed back to the squaring cell to control the scaling factor. In the circuit of FIG. 2, the squaring cell is implemented with a current output $I_{SQR}$, and the averaging circuit is implemented as a filter capacitor $C_{AVE}$ and a resistor R which are coupled in parallel to the output of the squaring cell at a node N1. A current source 26 provides a reference current $I_{REF}$ to node N1. An operational amplifier (op amp) 23 is connected so as to behave as an integrator to provide the final output signal $S_{OUT}$.

In measurement mode, the output signal servos the system by adjusting the scaling factor of the squaring cell until the average output current from the squaring cell equals the reference current $I_{REF}$. The filter capacitor $C_{AVE}$ is sized to provide a relatively short time constant for averaging the squared signal (e.g., about 10 ns for input frequencies of a few GHz), whereas the integrating circuit has a dominant pole that sets a relatively long time constant (typically on the order of 1 ms) for the outer control loop. The output signal $S_{OUT}$ is then a linear measure of the RMS value of input signal $S_{IN}$. Other output measures such as linear-in-dB are possible as discussed below.

Figure 3:
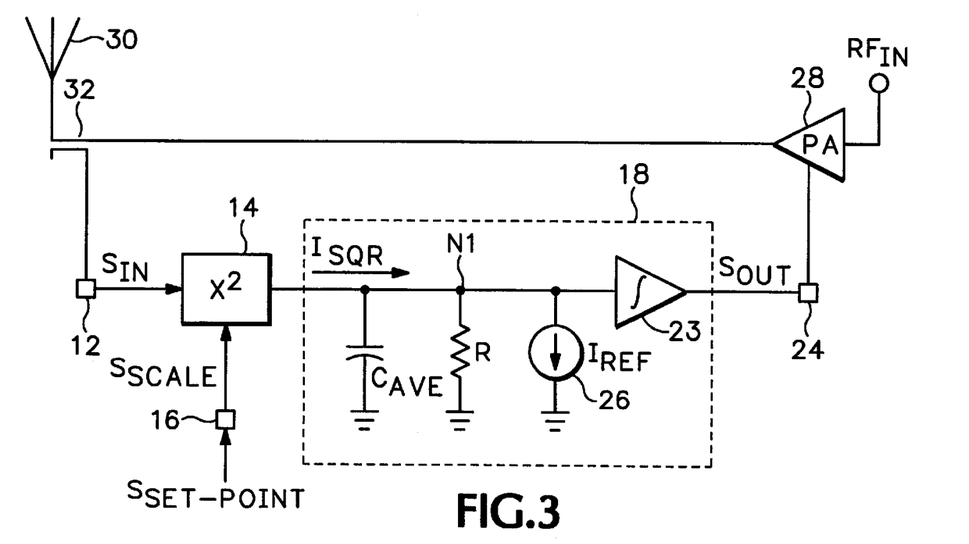
FIG. 3 is a simplified schematic diagram of the first exemplary embodiment of FIG. 2 shown configured in a controller mode.

FIG. 3 is a simplified schematic diagram showing a first exemplary embodiment of the RMS-DC converter of FIG. 1 configured for operation as a controller. In this configuration, the final output signal $S_{OUT}$ is used to control the gain of a variable-gain device, for example, an RF power amplifier 28 which drives antenna 30 in response to an RF input signal $RF_{IN}$. Directional coupler 32 provides a sample of the power from the amplifier which is used as the input to the squaring cell. A set-point signal $S_{SET}$ is applied to the squaring cell as the scaling signal.

In controller mode, the feedback path is through the power amplifier and directional coupler. The system servos until the power output from the amplifier reaches a level that corresponds to the value of the set-point signal. The scaling relationship between the set-point signal and the output power in this case is linear.

Figure 4:
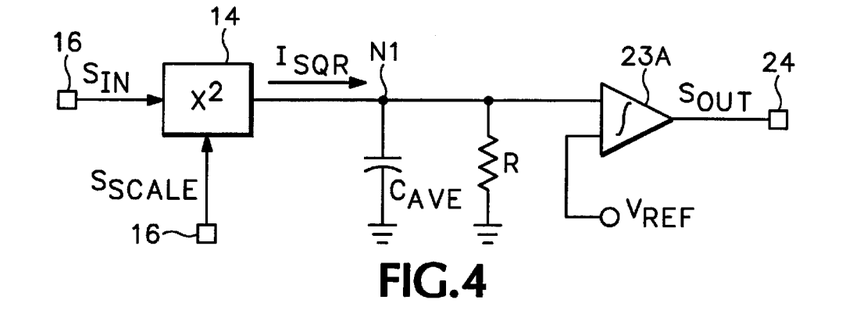
FIG. 4 is a simplified schematic diagram of a second exemplary embodiment of an RMS-DC converter in accordance with the present invention.

FIG. 4 is a simplified schematic diagram of a second exemplary embodiment of an RMS-DC converter in accordance with the present invention. In the circuit of FIG. 4, the set-point current source is replaced by a reference signal applied to the integrator as a reference voltage $V_{REF}$. The integrator in this case is an op amp 23A configured for a differential input.

Figure 5:
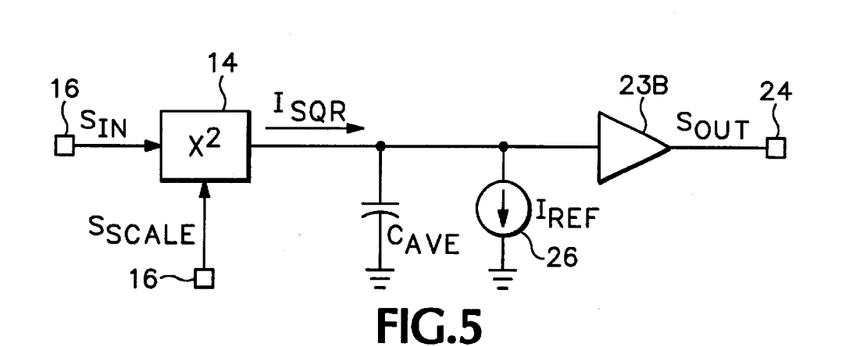
FIG. 5 is a simplified schematic diagram of a third exemplary embodiment of an RMS-DC converter in accordance with the present invention.

FIG. 5 is a simplified schematic diagram of a third exemplary embodiment of an RMS-DC converter in accordance with the present invention. In the circuit of FIG. 5, the resistor R is removed, so the capacitor $C_{AVE}$ performs both the integrating function and HF averaging function. The op amp integrator is replaced with a buffer amplifier 23B.

The embodiments shown in FIGS. 4 and 5 can be configured for operation in either measurement mode or controller mode as described above with respect to FIGS. 2 and 3.

Figure 6:
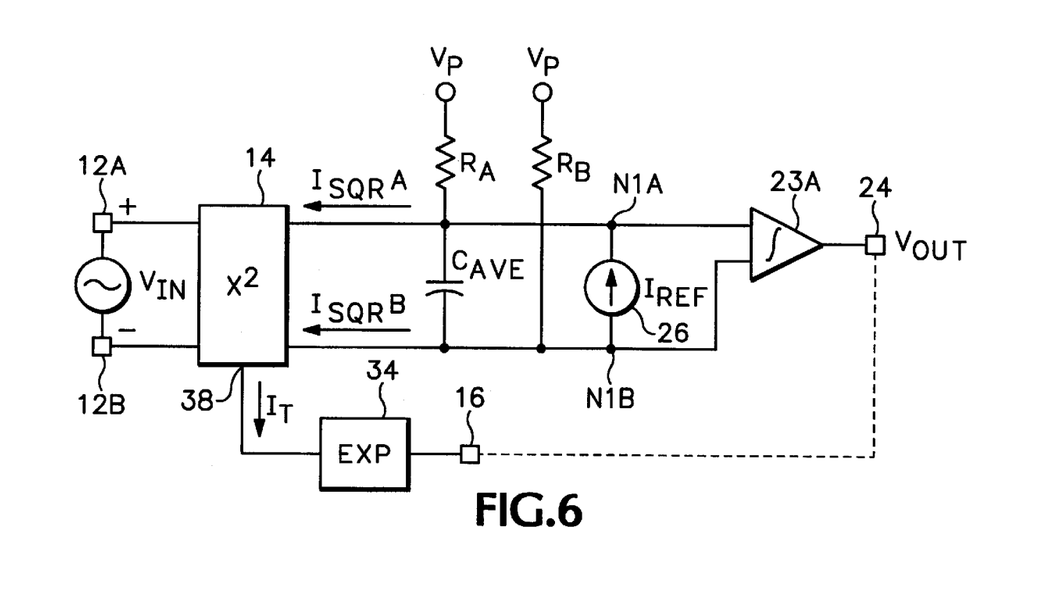
FIG. 6 is a simplified schematic diagram of a fourth exemplary embodiment of an RMS-DC converter in accordance with the present invention.

FIG. 6 is a simplified schematic diagram of a fourth exemplary embodiment of an RMS-DC converter in accordance with the present invention. In the circuit of FIG. 6, the squaring cell 14 is implemented as a three-transistor, common-emitter, multi-tanh transconductance cell as described below with reference to FIG. 7. The squaring cell receives the input signal as a voltage $V_{IN}$ shown for simplicity as being in differential form at terminals 12A and 12B, and provides the squared output signal as a differential current $I_{SQR}A$, $I_{SQR}B$ to nodes N1A and N1B. Resistors $R_A$ and $R_B$ are connected between nodes N1A and N1B and a power supply terminal $V_P$, to provide loads for converting the squared currents $I_{SQR}A$, $I_{SQR}B$ to voltages. The filter capacitor $C_{AVE}$ is connected between nodes N1A and N1B, as is the reference current source 26. The integrating op amp 23A is configured for a differential input. The final output signal from the op amp is the voltage $V_{OUT}$.

The scaling factor of the squaring cell is controlled utilizing the scaling bias current (or "tail" current) $I_T$ for the transconductance cell as the scaling signal. The scaling factor of the squaring cell varies linearly (in inverse proportion) with the tail current $I_T$. That is:

$$I_{SQR} \propto \frac{V_{IN}^2}{I_T} \quad \text{(Eq. 1)}$$

A simple bias circuit can be connected to the squaring cell to generate the tail current in response to a control signal. The output voltage $V_{OUT}$ can then be fed back to the second input terminal 16 as the control signal for operation in measurement mode. Alternatively, a set-point signal can be applied to the second input terminal 16 as the control signal for operation in controller mode similar to that shown in FIG. 3.

In the example shown in FIG. 6, however, the bias circuit includes a variable-gain amplifier 34 which is connected to the squaring cell to generate the tail current $I_T$ in response to the control signal. The variable-gain amplifier of FIG. 6 is a linear-in-decibel or "linear-in-dB" cell as described in more detail below with reference to FIG. 8. By providing a tail current that varies exponentially in response to the control signal, the variable gain amplifier causes the final output voltage $V_{OUT}$ to provide a linear-in-dB measure of the RMS value of the input voltage $V_{IN}$. The circuit of FIG. 6 can also be configured in a controller mode as shown in FIG. 3.

Figure 7:
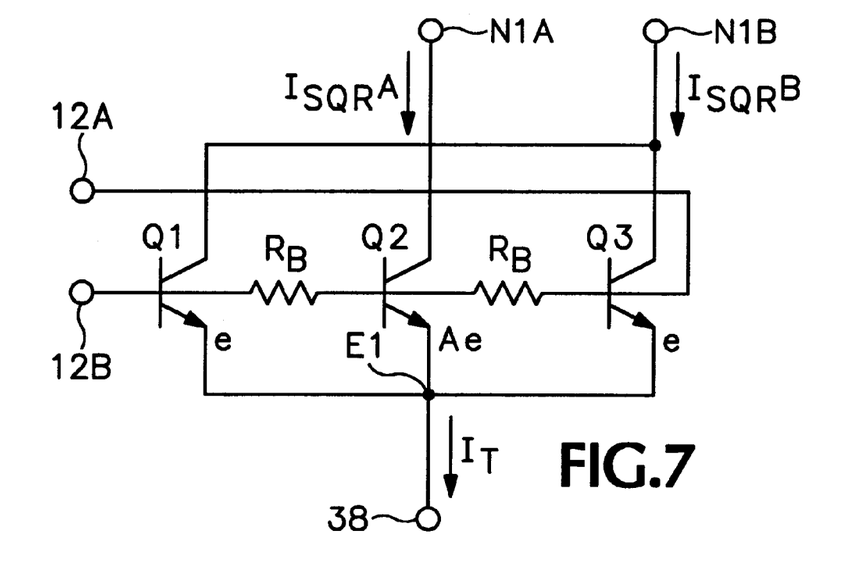
FIG. 7 is a schematic diagram of an embodiment of a squaring cell in accordance with the present invention.

FIG. 7 is a schematic diagram of an embodiment of a three-transistor, series-connected, common-emitter, multi-tanh transconductance cell suitable for use as the squaring cell in an RMS-DC converter in accordance with the present invention. The cell of FIG. 7 includes three NPN transistors Q1, Q2 and Q3. The bases of the "outer" transistors Q1 and Q3 receive the differential input voltage $V_{IN}$. A first resistor $R_B$ is connected between the bases of Q1 and the center transistor Q2, and a second resistor $R_B$ is connected between the bases of Q2 and Q3. The collector of Q2 provides the current $I_{SQR}A$ to node N1A, while the collectors of the collectors of Q1 and Q3 are connected together to provide the current $I_{SQR}B$ to node N1B. The emitters of Q1–Q3 are commonly connected at node E1. Transistors Q1 and Q3 have an emitter area "e", and transistor Q2 has an emitter area of "Ae", that is, a multiple (A) of e. The squaring cell of FIG. 7 is described in co-pending U.S. patent application Ser. No. 09/245,051 filed Feb. 4, 1999 which is by the same inventor as the present application, and is incorporated herein by reference. However, rather than operating the squaring cell at a fixed tail current, the circuit of FIG. 6 dynamically adjusts the scaling factor of the squaring cell by varying the tail current in response to the control signal.

Figure 8:
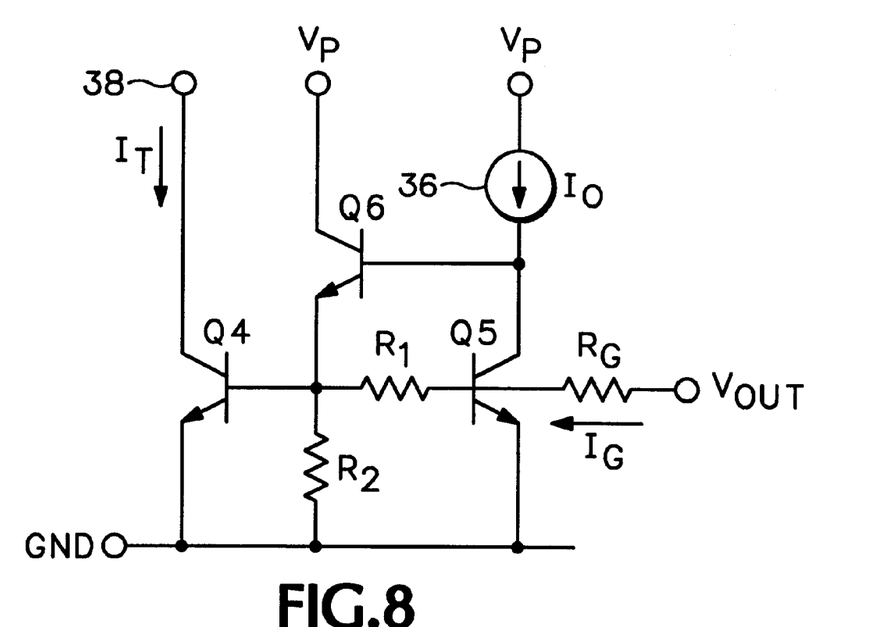
FIG. 8 is a schematic diagram of an embodiment of a bias circuit for use with a squaring cell in accordance with the present invention.

FIG. 8 is a schematic diagram of an embodiment of a bias circuit for use with a squaring cell in accordance with the present invention. The bias circuit of FIG. 8 is essentially an exponential cell including a current mirror formed by NPN transistors Q4 and Q5 which have a resistor $R_G$ connected between there respective bases. Transistor Q5 has en emitter area of "e", and transistor Q4 has an emitter area of "Me". A third transistor Q6 has its emitter connected to the base of Q4, its base connected to the collector of Q5, and its collector connected to $V_P$. A second resistor R is connected between the base of Q4 and GOD. A voltage-to-current converter 42 is connected between the base of Q5 and input terminal 16 which receives an input voltage $V_G$. The final output signal $V_{OUT}$ is used as the input signal $V_G$ when the converter is configured in measurement mode. The collector of Q4 is connected to node E1 of the multi-tanh cell of FIG. 7 to provide the tail current $I_T$ thereto.

A current source 36 is connected to the collector of Q5.

The voltage-to-current converter 42 generates the current $I_G$ in response to the voltage $V_G$ and the bias current $I_B$ according to the following equation: $I_G = I_B(V_G/V_R)$ where $V_R$ is a scale factor. In a preferred embodiment, $I_B$ is proportional to absolute temperature (PTAT).

Voltage-to-current converters are known in the art, so the details need not be described here.

Current source 36 sets up a bias current $I_0$ in Q5 which, in the absence of any gain control current $I_G$ through $R_G$, is mirrored in Q4 and multiplied by the emitter area ratio "M". As the input voltage at terminal 16 increases, the gain control current $I_G$ increases and establishes a voltage across $R_G$. This produces a corresponding exponential decrease in the collector tail current $I_T$ through the collector of Q4. Transistor Q6 servos the mirror, and resistor R absorbs the gain control current. Since the base of Q5 is essentially one $V_{BE}$ above GND, $I_G$ is proportional to $V_{OUT}$, so the tail current $I_T$ is:

$$I_T = MI_0 e^{-I_G R_G / V_T} \quad \text{(Eq. 2)}$$

Thus, the bias circuit of FIG. 8 varies the tail current $I_T$ exponentially in response to linear changes in the final output voltage and, therefore, provides a linear-in-dB output characteristic.

Figure 9:
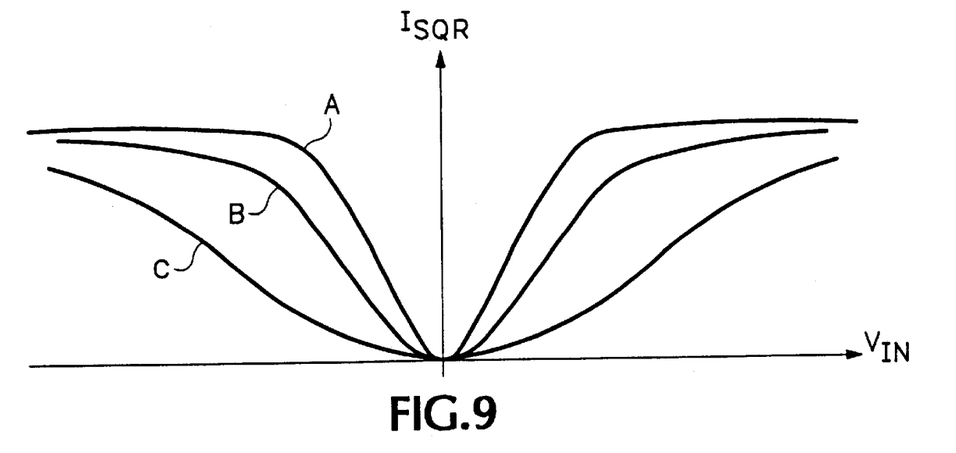
FIG. 9 is a diagram showing the output characteristics of the squaring cell of FIG. 7 for different operating temperatures.

One potential problem with the squaring cell shown in FIG. 7 is that the output characteristics change as the operating temperature changes. This can be understood with reference to FIG. 9 where the output from the squaring cell at 300° K as curve B. At lower temperatures, the output curve becomes sharper as shown by curve A, thereby reducing the dynamic range. At higher temperatures, the curve becomes shallower as shown by curve C, thereby reducing the sensitivity at low input voltages. These temperature related changes in the shape of the output curve of the cause inaccuracies in the averaging function following the squaring function.

Figure 10:
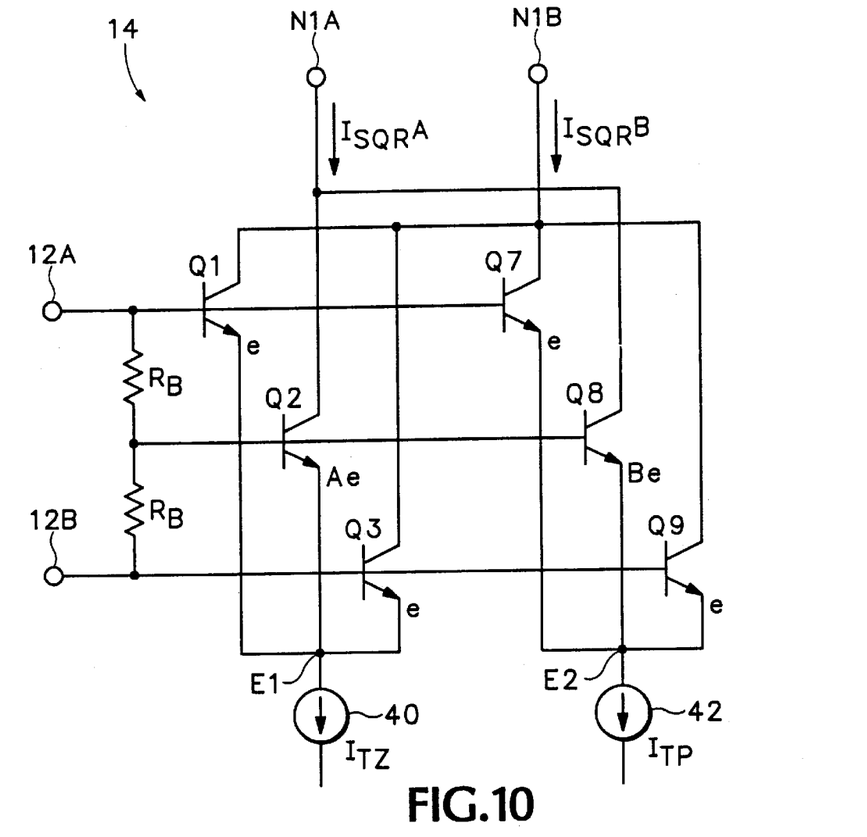
FIG. 10 is a schematic diagram of a preferred embodiment of a squaring cell in accordance with the present invention.

FIG. 10 is a schematic diagram of a preferred embodiment of a squaring cell accordance with the present invention which overcomes the problems associated with operation over a wide range of temperatures. The squaring cell of FIG. 10 utilizes two overlapping squaring cells driven by tail currents having different temperature characteristics to provide a combined output curve that remains constant over a wide range of temperatures.

Referring to FIG. 10, the squaring cell includes two resistors RB and a multi-tanh triplet of transistors Q1–Q3 which are arranged in the same manner as in FIG. 7 except that the triplet is biased by a current source 38 which generates a tail current $I_{TZ}$ having a temperature coefficient of zero. That is, the current $I_{TZ}$ remains constant over the entire range of operating temperatures. A second triplet including transistors Q7–Q9 are arranged to overlap the first triplet such that the base and collector of each of Q7–Q9 are connected to the base and collector of a corresponding one of Q1–Q3. However, the emitters of Q7–Q9 are connected together at a second emitter node E2, and biased by a current source 40 which generates a tail current $I_{TP}$ with is PTAT (proportional to absolute temperature) or, preferably, super-PTAT as described below. The output currents from both triplets are combined at nodes N1A and N1B to provide an output characteristic which remains constant with temperature variations.

In a preferred embodiment, the emitter area ratio of the transistors in the first triplet is about 40:1, and area ratio of the transistors in the second triplet is about 3.5:1. That is, transistor Q2 has an emitter area which is 40 times the emitter area of transistors Q1 and Q3, and transistor Q8 has an emitter area which is 3.5 times the emitter area of transistors Q7 and Q9. These specific area ratios are examples that have been found to operate effectively in simulations, but other values can also be utilized.

Super-PTAT means that the parameter varies with temperature faster than it would if it were PTAT. One way to generate a super-PTAT signal is to use a BJT transistor having a grounded resistor in its emitter, its collector taken to a fixed bias, and its base connected to a voltage source with respect to ground. If the base voltage is set to the bandgap voltage (about 1.2 volts), the emitter voltage will be almost exactly PTAT, and thus, the collector current will likewise be PTAT. If the base voltage is somewhat lower than the bandgap voltage, for example, about 1 volt, the collector current will be super-PTAT.

An advantage of the present invention is that it provides a simple and low cost solution that can achieve extended dynamic range and accurate operation at frequencies of several GHz when implemented with a simple squaring cell such as that shown in FIG. 7. Another advantage is that an exponential-responding element can be used in the feedback path (in measurement mode) or the set-point path (in controller mode) to provide linear-in-dB response.

The embodiments of the present invention described above with reference to FIGS. 1–10 utilize squaring cells as the detectors since a squaring cell provides an accurate measure of the RMS value of the signal being measured. An RMS-DC converter in accordance with the present invention can utilize other types of detector cells (provided the scaling factor can be adjusted dynamically), but the system will provide a metric other than RMS. For example, an absolute value circuit having a dynamically adjustable scaling factor can be utilized as the detector cell. Such a system will generally not measure the actual RMS value of an arbitrary signal, but can still provide some useful information about the power of the signal. Thus, a squaring cell is but one type of detector that can be utilized with the present invention, and a squared signal is but one type of output signal from a detector cell.

Having described and illustrated the principles of the invention in preferred embodiments thereof, it should be apparent that the invention can be modified in arrangement and detail without departing from such principles. For example, CMOS transistors or other current control devices can be substituted for the bipolar transistors shown in the illustrated embodiments. Although the present invention has been illustrated with embodiments having predominantly NPN transistors, the embodiments can be readily implemented using PNP transistors. Also, squaring cells other than those shown in FIGS. 7 and 10 can be utilized. For example, the squaring cells described in co-pending U.S. patent application Ser. Nos. 09/245,051; 09/256,640; and 09/473,309 can also be adapted for use with the present invention.

What is claimed is:

1. An RMS-DC converter comprising:
   a detector cell for generating an output signal responsive to an input signal; and
   an averaging circuit coupled to the detector cell for generating a final output signal responsive to the output signal;
   wherein the detector cell is a squaring cell having a scaling factor that can be adjusted dynamically responsive to a scaling signal.

2. An RMS-DC converter according to claim 1 further including an amplifier coupled to the detector cell for generating the scaling signal.

3. An RMS-DC converter according to claim 2 wherein the amplifier is a variable gain amplifier.

4. An RMS-DC converter according to claim 1 wherein the squaring cell is a transconductance cell having a bias input terminal for receiving a bias current as the scaling signal, and further including a bias circuit coupled to the bias input terminal of the squaring cell for generating the bias current.

5. An RMS-DC converter according to claim 1 wherein the averaging circuit includes a capacitor coupled to the detector cell.

6. An RMS-DC converter according to claim 5 wherein the averaging circuit further includes:
   a resistor coupled to the capacitor;
   a current source coupled to the capacitor; and
   an integrator coupled to the capacitor.

7. An RMS-DC converter according to claim 5 wherein the averaging circuit further includes:
   a resistor coupled to the capacitor;
   an integrator having a first input terminal coupled to the capacitor and a second input terminal for receiving a reference voltage.

8. An RMS-DC converter according to claim 7 wherein the integrator is an operational amplifier.

9. An RMS-DC converter comprising:
   a detector cell for generating an output signal responsive to an input signal;
   an averaging circuit coupled to the detector cell for generating a final output signal responsive to the output signal; and an amplifier coupled to the detector cell for generating a scaling signal;

wherein the detector cell has a scaling factor that can be adjusted dynamically responsive to the scaling signal; and wherein the amplifier is a linear-in-dB cell.

10. An RMS-DC converter comprising:

a detector cell for generating an output signal responsive to an input signal; and an averaging circuit coupled to the detector cell for generating a final output signal responsive to the output signal;

wherein the detector cell has a scaling factor that can be adjusted dynamically responsive to a scaling signal;

wherein the detector cell is a squaring cell;

wherein the squaring cell is a transconductance cell having a bias input terminal for receiving a bias current as the scaling signal, and further including a bias circuit coupled to the bias input terminal of the squaring cell for generating the bias current; and wherein the squaring cell is a common-emitter multi-tanh cell.

11. An RMS-DC converter comprising:

a detector cell for generating an output signal responsive to an input signal; and an averaging circuit coupled to the detector cell for generating a final output signal responsive to the output signal;

wherein the detector cell has a scaling factor that can be adjusted dynamically responsive to a scaling signal;

wherein the detector cell is a squaring cell;

wherein the squaring cell is a transconductance cell having a bias input terminal for receiving a bias current as the scaling signal, and further including a bias circuit coupled to the bias input terminal of the squaring cell for generating the bias current; and wherein the bias cell is a linear-in-dB cell.

12. An RMS-DC converter comprising:

a detector cell for generating an output signal responsive to an input signal; and an averaging circuit coupled to the detector cell for generating a final output signal responsive to the output signal;

wherein the detector cell has a scaling factor that can be adjusted dynamically responsive to a scaling signal; and wherein the averaging circuit is coupled to the detector cell to provide the final output signal to the detector cell as the scaling signal.

13. An RMS-DC converter according to claim 12 further including an amplifier coupled between the averaging circuit and the detector cell.

14. An RMS-DC converter comprising:

a detector cell for generating an output signal responsive to an input signal; and an averaging circuit coupled to the detector cell for generating a final output signal responsive to the output signal;

wherein the detector cell has a scaling factor that can be adjusted dynamically responsive to a scaling signal; and wherein:

the averaging circuit is coupled to a variable-gain device to control the gain of the variable-gain device;

the variable-gain device includes an output terminal coupled to the detector cell to provide the input signal to the detector cell; and the detector cell is coupled to receive a set-point signal as the scaling signal.

15. A method for performing an RMS-DC conversion comprising:

detecting an input signal with a squaring cell having a scaling factor, thereby generating an output signal;

averaging the output signal, thereby generating a final output signal; and dynamically adjusting the scaling factor of the squaring cell.

16. A method according to claim 15 wherein averaging the output signal includes summing the output signal and a reference signal.

17. A method according to claim 15 wherein averaging the output signal includes integrating the difference between the output signal and a reference signal.

18. A method according to claim 15 wherein adjusting the scaling of the squaring cell includes:

generating a scaling signal; and applying the scaling signal to the squaring cell.

19. A method according to claim 18 wherein generating the scaling signal includes amplifying a control signal.

20. A method according to claim 15 wherein:

the squaring cell is a transconductance cell having a scale factor that varies responsive to a bias current; and adjusting the scaling of the squaring cell includes varying the bias current.

21. A method for performing an RMS-DC conversion comprising:

detecting an input signal with a detector cell having a scaling factor, thereby generating an output signal;

averaging the output signal, thereby generating a final output signal; and dynamically adjusting the scaling factor of the detector cell;

wherein adjusting the scaling factor of the detector cell includes adjusting the scaling of the detector cell responsive to the final output signal.

22. A method for performing an RMS-DC conversion comprising:

detecting an input signal with a detector cell having a scaling factor, thereby generating an output signal;

averaging the output signal, thereby generating a final output signal; and dynamically adjusting the scaling factor of the detector cell;

wherein adjusting the scaling factor of the detector cell includes applying a set-point signal to the detector cell; and the method further includes:

controlling the gain of a variable-gain device responsive to the final output signal; and coupling an output signal from the variable-gain device to the detector cell as the input signal.

23. A method for performing an RMS-DC conversion comprising:

detecting an input signal with a detector cell having a scaling factor, thereby generating an output signal;

averaging the output signal, thereby generating a final output signal; and dynamically adjusting the scaling factor of the detector cell;

wherein adjusting the scaling of the detector cell includes:
generating a scaling signal; and
applying the scaling signal to the detector cell; and
wherein generating the scaling signal includes generating the scaling signal such that it varies exponentially responsive to a control signal.

24. A method for performing an RMS-DC conversion comprising:
detecting an input signal with a detector cell having a scaling factor, thereby generating an output signal;
averaging the output signal, thereby generating a final output signal; and
dynamically adjusting the scaling factor of the detector cell;
wherein the detector cell is a transconductance cell having a scale factor that varies responsive to a bias current;
wherein adjusting the scaling of the detector cell includes varying the bias current; and
wherein varying the bias current includes varying the bias current exponentially responsive to a control signal.

25. An RMS-DC converter comprising:
means for squaring an input signal responsive to a scaling signal, thereby generating a squared signal;
means for averaging the squared signal, thereby generating an output signal; and
means for generating the scaling signal.

26. An RMS-DC converter according to claim 26 wherein:
the means for squaring the input signal is a transconductance cell having a scale factor that varies responsive to a bias current; and
the means for generating the scaling signal is a bias circuit adapted to vary the bias current responsive to a control signal.

27. An RMS-DC converter comprising:
means for squaring an input signal responsive to a scaling signal, thereby generating a squared signal;
means for averaging the squared signal, thereby generating an output signal; and
means for generating the scaling signal;
wherein the means for squaring the input signal is a transconductance cell having a scale factor that varies responsive to a bias current;
wherein the means for generating the scaling signal is a bias circuit adapted to vary the bias current responsive to a control signal; and
wherein the bias circuit includes an exponential cell.

28. A squaring cell comprising:
a first multi-tanh triplet having first and second input terminals, first and second output terminals, and a first bias terminal;
a first current source coupled to the first bias terminal of the first multi-tanh triplet to provide a first bias current to thereto;
a second multi-tanh triplet having first and second input terminals coupled to the first and second input terminals of the first multi-tanh triplet, first and second output terminals coupled to the first and second output terminals of the first multi-tanh triplet, and a second bias terminal; and
a second current source coupled to the second bias terminal of the second multi-tanh triplet to provide a second bias current to thereto.

29. A squaring cell according to claim 28 wherein:
the first current source is constructed such that the first bias current remains substantially constant with changes in operating temperature; and
the second current source is constructed such that the second bias current varies with changes in operating temperature.

30. A squaring cell according to claim 29 wherein the second current source is constructed such that the second bias current is PTAT.

31. A squaring cell according to claim 29 wherein the second current source is constructed such that the second bias current is super PTAT.

* * * * *

UNITED STATES PATENT AND TRADEMARK OFFICE
CERTIFICATE OF CORRECTION

PATENT NO.    : 6,348,829 B1
DATED         : February 19, 2002
INVENTOR(S)   : Gilbert It is certified that error appears in the above-identified patent and that said Letters Patent is hereby corrected as shown below:

Column 2,
Line 7, "the converter shown" should read -- the converter 10 shown --.

Column 4,
Line 29, Q4 and GOD." should read -- Q4 and GND. --.

Column 5,
Line 16, "resistors RB" should read -- resistors RB --.

Column 9,
Line 29, "according to claim 26" should read -- according to claim 25 --.

Signed and Sealed this

Thirteenth Day of April, 2004

JON W. DUDAS
*Acting Director of the United States Patent and Trademark Office*